United States Patent [19]

Baji et al.

[11] Patent Number: 4,495,409
[45] Date of Patent: Jan. 22, 1985

[54] PHOTOSENSOR WITH DIODE ARRAY

[75] Inventors: Toru Baji, Kokubunji; Naohiko Koizumi, Mobara; Toshihisa Tsukada, Tokyo; Hideaki Yamamoto, Tokorozawa; Yasuharu Shimomoto, Tokyo; Yasuo Tanaka, Kokubunji, all of Japan

[73] Assignee: Hitachi, Ltd., Tokyo, Japan

[21] Appl. No.: 348,669

[22] Filed: Feb. 16, 1982

[51] Int. Cl.³ ............................................. H01J 40/14
[52] U.S. Cl. .................................. 250/211 J; 250/578
[58] Field of Search ................. 250/211 R, 211 J, 578; 358/212, 213; 357/24 LR, 31, 32

[56] References Cited

U.S. PATENT DOCUMENTS

| | | | |
|---|---|---|---|
| 3,900,716 | 8/1975 | Kawabata et al. | 250/211 J |
| 4,067,046 | 1/1978 | Nakatani et al. | 358/213 |
| 4,155,006 | 5/1979 | Sato et al. | 250/211 J |
| 4,288,702 | 9/1981 | Ozawa et al. | 250/578 |
| 4,369,372 | 1/1983 | Yoshioka et al. | 357/32 |

Primary Examiner—David C. Nelms
Attorney, Agent, or Firm—Antonelli, Terry & Wands

[57] ABSTRACT

A photosensor comprising an array of a plurality of unit picture elements each of which is constituted by a serial connection of a photoconductor film and a diode or a combination of a photodiode and a diode connected in series to the photodiode in the opposite rectifying direction, wherein the plurality of unit picture elements being divided into at least two groups, the unit picture elements belonging to the respective groups being connected to corresponding first group of wiring conductors provided in association with the groups, respectively, while the unit picture elements belonging to the different groups and located at same positions in the different groups relative to one another are connected together to respective second group of wiring conductors, including a first biasing controller for applying a voltage to the first group of wiring conductor connected to the picture element from which a signal is to be read out, the voltage serving for biasing forward the diode of the picture element to be read out, while no forward bias voltage is applied to the first group of wiring conductors connected to the unit picture elements from which signals are not to be read out; and a second biasing controller provided for one of the second group of wiring conductor connected to the unit picture element to be read out for grounding or biasing forward the diode of the picture element to be read out through a capacitance, whereby electric charges stored at nodes located between the photoconductor films and the diodes or between the photodiodes and the diodes, respectively, are sequentially read out as signals.

8 Claims, 33 Drawing Figures

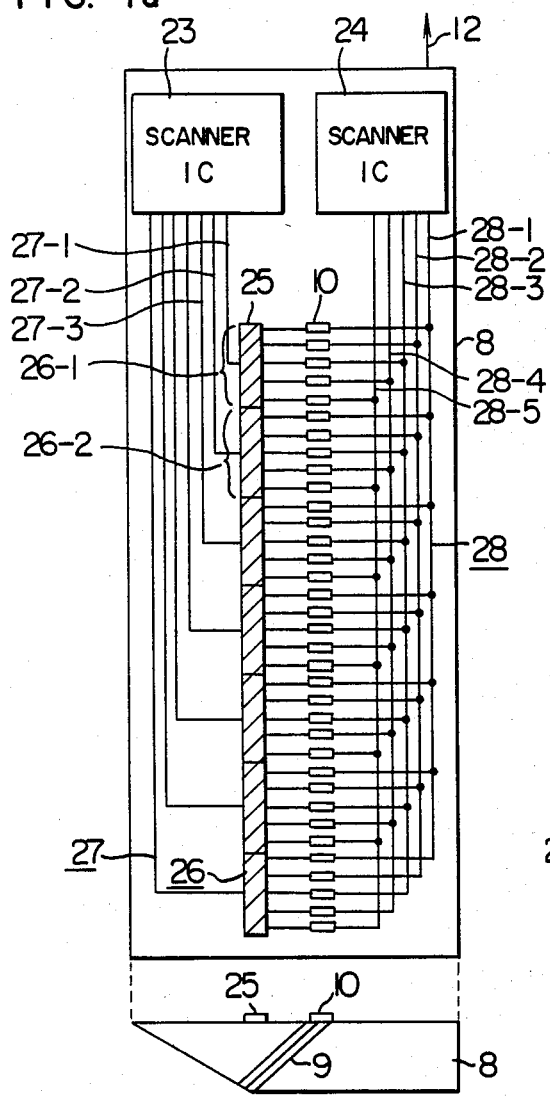
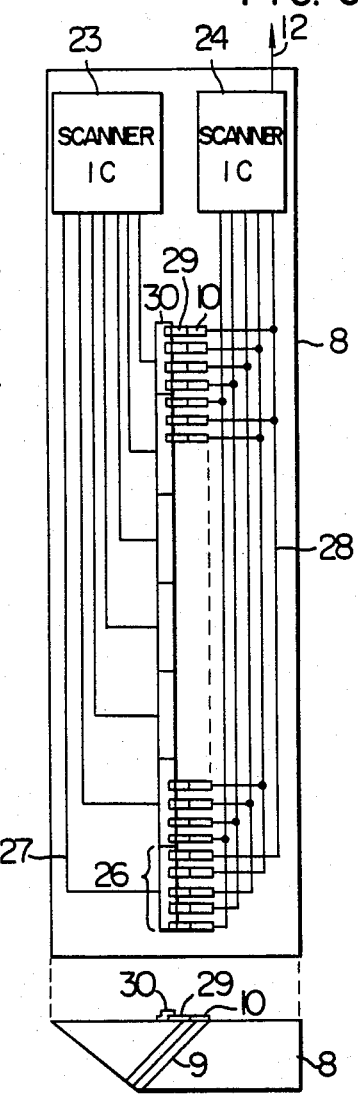
FIG. 4a
FIG. 4b
FIG. 5a
FIG. 5b

PHOTOSENSOR WITH DIODE ARRAY

BACKGROUND OF THE INVENTION

The present invention relates generally to a photosensor and more particularly concerns a photosensor device for use in facsimile equipment, optical character recognition systems and the like.

A known type facsimile transmitter reads out information from an original or document by means of a photosensor or image sensor disposed in close contact with the document. The use of the contact type linear image sensor makes it unnecessary to optically reduce the size of document, so that an optical system otherwise required can be dispensed with.

Typical examples of such image sensors are disclosed in U.S. Pat. No. 4,227,078, U.S. Pat. No. 4,233,506 and others. In FIG. 1 of the accompanying drawings, there is shown in a perspective view a contact type linear image sensor, in which a reference numeral 1 denotes an original or document, 4 denotes an illuminating light source, and 8 denotes generally a photosensor device. An arrow 2 represents the direction in which the document 1 is scanned.

A hitherto known structure of the contact type linear image sensor in which optical fibers 9 are used for picking up image information is shown in FIGS. 2a and 2b of the accompanying drawings in a schematic sectional view and a top plan view, respectively. In these figures, a reference numeral 1 denotes a document, 4 denotes an illuminating light source, 8 denotes a base plate or substrate, 10 denotes photosensors, 11 denotes IC's (integrated circuits) for driving the photosensor elements 10, and a reference numeral 13 denotes a rotatable roller. On the other hand, FIGS. 2c and 2d show in a schematic sectional view and a top plan view, respectively, a hitherto known structure of the contact type linear image sensor in which photodiodes 10 are used in place of the optical fibers as the information reading sensor elements and are adapted to be positioned in direct contact with the document. In these figures, a reference numeral 15 denotes a substrate, 11 denotes IC's for driving photosensor elements 10, and a numeral 13 denotes a rotatable roller. In the case of the image sensor structure shown in FIGS. 2c and 2d, light transmissive windows 14 are formed in the substrate 15, being interposed between the photodiodes 10 in alignment therewith, for illuminating the document 1 with light emitted from a light source 4. FIG. 3 shows an exemplary arrangement of a scanning circuit used in combination with the linear image sensor device illustrated in FIGS. 2a to 2d. Referring to FIG. 3, each of scanning IC's 11 includes MOS transistors 16 serving as gates for selecting the photodiodes and a shift register 17 for sequentially driving these gates 16. The photodiode is represented by an equivalent circuit in this figure as indicated by a circle 10 and assumed to be composed of a photocurrent source 18 for producing a current varying in dependence on the quantity of incident light and an equivalent capacitor 19. A reference numeral 20 denotes a source of bias voltage applied to the photodiodes 10.

Operations of photo-electrical conversion and the data read-out are carried out in the manner described below. Immediately after the pick-up of image data from a document, circuit points 22 are set to the ground potential by way of the selecting transistors 16, as the result of which the capacitors 19 are charged to the bias voltage $V_T$ by the bias voltage source 20. Subsequently, the transistors are turned off, whereby the circuit points 22 are disconnected from the ground potential. In this state, the capacitors 19 are discharged through the photo-current sources 18. In this manner, carriers as generated are stored in the capacitors 19. The signals representing quantities of carriers stored in the individual capacitors 19 can be read out through a common line 12 sequentially as the MOS transistors 16 are sequentially turned on under the control of the shift registers 17, 17' and 17". The scanning system of this type requires a number of transistors 16 which corresponds to the number of picture elements represented by the photodiodes as well as a corresponding number of the driving stages 17 for driving the photodiodes. For example, in the case of the contact type image sensor having 1760 picture elements (photodiodes), as many as twenty-two IC's are required on the assumption that the single scanning IC is assigned with 80 picture elements to be scanned. This makes the image sensor quite expensive. Further, the number of pin contacts required for each of the scanner IC's amounts in total to about 90 inclusive of 80 pins for connection to the picture elements or photodiodes and about 10 pins for connection to the power supply and the like. Under these circumstances, when twenty-two IC's are to be incorporated in the single image sensor of the contact type as mentioned above, 1980 ($=90\times22$) connections will be required. Such high density of the connections required for the IC packages demands extremely complicated and sophisticated manufacturing procedures, involving great difficulties in implementation of the image sensor for practical applications. This problem can be readily appreciated when one considers the fact that the number of connections required in a conventional IC package amounts to at most about twenty.

SUMMARY OF THE INVENTION

An object of the present invention is to provide an improved photosensor which avoids the shortcomings of the prior art photosensors and can perform a scanning operation with a significantly reduced number of constituent elements in a simple and inexpensive structure.

In view of the above object, there is provided according to an aspect of the invention a photosensor comprising an array of a plurality of unit picture elements each of which is constituted by a serial connection of a photoconductor film and a diode or a combination of a photodiode and a diode connected in series to the photodiode in the opposite rectifying direction, wherein the plurality of unit picture elements are divided into at least two groups, the unit picture elements belonging to the respective groups being connected to corresponding column wiring conductors (or row wiring conductors) provided in associated with the groups, respectively, while the unit picture elements belonging to the different groups and located at the same positions in the different groups relative to one another are connected together to respective row wiring conductors (or column wiring conductors). The photosensor includes means for applying a voltage to the column wiring conductor (or row wiring conductor) connected to the picture element from which a signal is to be read out, the voltage serving for forward biasing the diode of the picture element to be read out, while no forward bias voltage is applied to the column wiring conductors (or row wiring conductors) connected to the unit picture elements from which signals are not to be read out, and means provided for the row wiring conductor (or column wiring conductor) connected to the unit picture element to be read out for grounding or forward biasing the diode of the picture element to be read out through a capacitance, whereby electric charges stored at nodes located between the photoconductor films and the diodes or between the photodiodes and the diodes, respectively, are read out as information signals.

BRIEF DESCRIPTION OF THE DRAWINGS

FIGS. 4a and 4b show in a plan view and a sectional view, respectively, a matrix driven photosensor according to an exemplary embodiment of the invention in which a diode array chip is employed.

FIGS. 5a and 5b show in a plan view and a sectional view, respectively, a matrix driven photosensor according to another exemplary embodiment of the invention in which amorphous silicon diodes are employed.

DETAILED DESCRIPTION OF THE PREFERRED EMBODIMENTS

Figure 1:
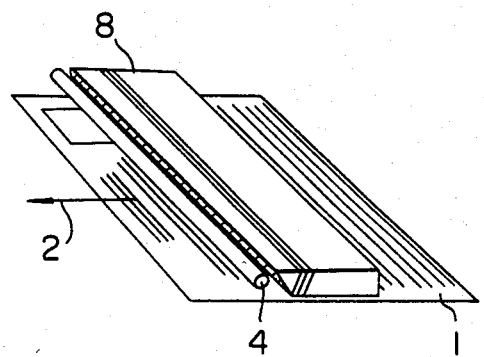
FIG. 1 shows a contact type linear image sensor in a schematic perspective view.
Figure 2B:
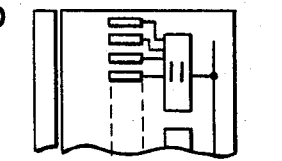
FIGS. 2a and 2b show a hitherto known linear image sensor of the contact type in a side view and a top plan view, respectively.
Figure 2A:
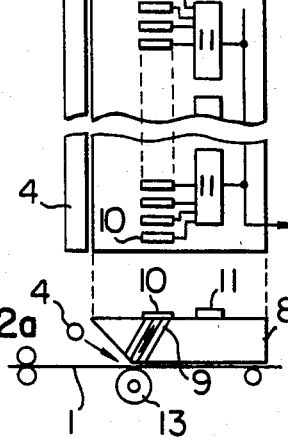
Figure 2D:
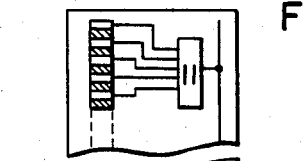
FIGS. 2c and 2d show another known contact type linear image sensor in a side view and a top plan view.
Figure 2C:
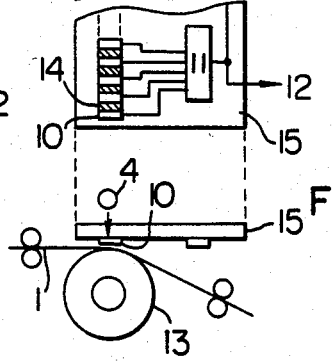
Figure 3:
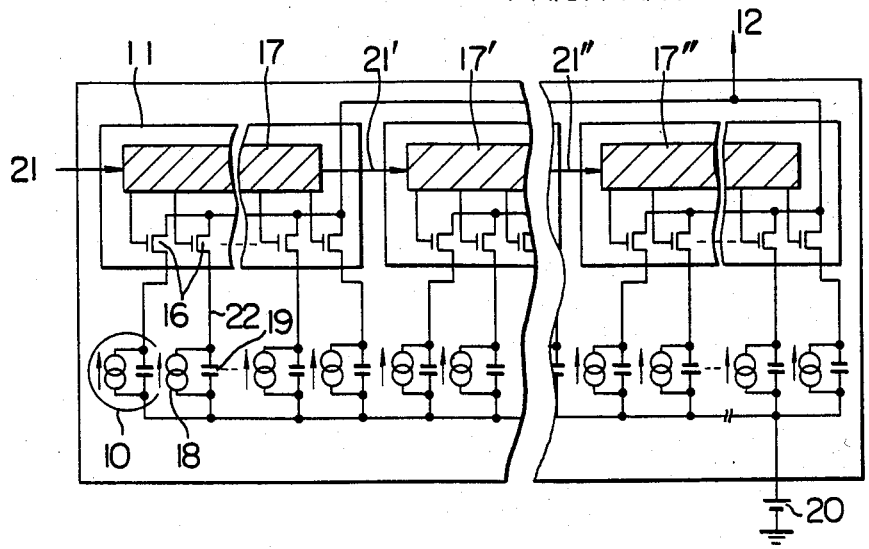
FIG. 3 shows a circuit diagram of a hitherto known linear sensor of the contact type.

According to the teaching of the invention, it is taught that all the picture elements are classed or divided into a plurality of groups, wherein the scanning is effected on the group base with the scanner circuit being significantly simplified. With the invention, it is possible to decrease the number of the scanner IC's while the number of connecting pins can be greatly reduced, whereby a contact type linear image sensor can be realized which is very excellent in respect of the manufacturing costs and adaptability for mass production.

FIGS. 4a and 4b as well as FIGS. 5a and 5b show exemplary embodiments of the photosensor according to the invention, in which FIGS. 4a and 5a are plan views of the sensors and FIGS. 4b and 5b are sectional views of the same. Referring to FIG. 4b, a reference numeral 8 denotes a glass substrate, 9 denotes optical fibers for conduction of optical image information, 10 denotes a photodiode array for photosensing (i.e. sensing through photoelectrical conversion), and 25 denotes a diode array for preventing cross talk from occurring between adjacent picture elements by appropriately controlling signal flows. Each diode of the diode array 25 has one end connected to the corresponding photodiode of the photodiode array 10, while the other ends of the diodes of the diode array 25 are grouped into a plurality of groups in which the other ends of the diodes are connected in common to one another as indicated at 26-1, 26-2, ..., 26-n in FIG. 4a and connected to a scanner IC 23 through respective wiring conductors 27. The other ends of the photodiodes 10 which are not connected to the diodes of the array 25 are connected in such a manner that the other ends of the photodiodes belong to the different groups of the diodes 25 and located at the same positions in the groups relative to one another are connected together to respective wiring conductors 28 which lead to another scanner circuit 24. In the following, the diode groups such as the group 26 will be referred to as the diode columns, while the diodes located at the relatively identical positions in the different groups, respectively, will be referred to as the diode rows. Further, the IC 23 will be referred to as the column scanner IC with the IC 24 termed the row scanner IC. The illustrated photosensor may thus be called the matrix driven sensor in which the read-out operation is carried out through scanning one-by-one the row and the column diodes. The read-out operation will be briefly explained with reference to FIG. 4a. At first, the diode column 26-1 is selected through a wiring conductor 27-1 and the row wiring conductors 28-1 to 28-5 are energized sequentially one-by-one. Thus, the photodiodes associated with the diode column 26-1 are sequentially scanned one-by-one. Next, the diode column 26-2 is selected through a wiring conductor 27-2 and the wiring conductors 28-1 to 28-5 are energized sequentially one-by-one. Thus, all of the photodiodes of the photodiode array 10 are sequentially scanned. The sensor shown in FIGS. 4a and 4b is implemented by packaging the IC of the diode array fabricated through a conventional silicon IC manufacturing process. On the other hand, in the case of the exemplary embodiment shown in FIGS. 5a and 5b, a diode array 29 corresponding to the one 25 shown in FIG. 4a is realized through a process substantially similar to the process for fabricating the photodiodes 10 in a simplified manufacturing procedure as compared with those shown in FIG. 4a. In FIGS. 5a and 5b, a reference numeral 30 designates common electrodes or regions of a same conductivity type (n or p) for the individual groups of the diodes 29. In the former case, metal-semiconductor junctions are formed between the common electrodes 30 and the diodes 29, respectively, or alternatively PN— or p-i-n junctions are formed in the diodes 29 so as to impart a rectifying function or capability. In the case of the latter, PN-junctions or pin-junctions are formed between the regions 30 and the photodiodes 29 to provide the rectification.

Next, a description will be given of the fundamental concept of the operation mechanism of the matrix-driven read-out system according to the invention.

First, the operation mechanism of an unit picture element will be described.

The gist of the operation principle resides in that the photoelectrically generated electrical charges are stored at nodes located between the diodes and the photoconductive films disposed opposite to each other or between the diodes and the photodiodes also oppositely disposed, which nodes are electrically isolated from the ambience (i.e. other circuit parts), wherein the diodes are turned on only upon reading-out the signals to thereby extract the signal charges from the nodes. When this principle is to be realized in the matrix array, a power supply source for backward biasing the diodes to prevent the cross-talk and other relevant circuit elements will be required.

Figure 6A:
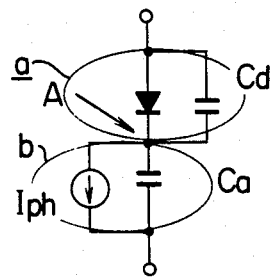
FIGS. 6a and 6b are views to illustrate equivalent circuits of unit picture elements.
Figure 6B:
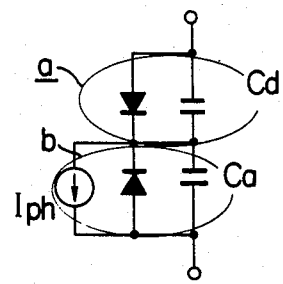
Figure 6C:
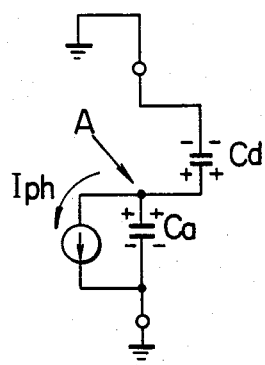
FIGS. 6c and 6d are equivalent circuit diagrams to illustrate operations of a picture element.
Figure 6D:
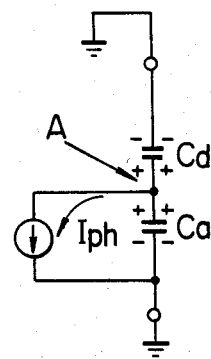
Figure 6E:
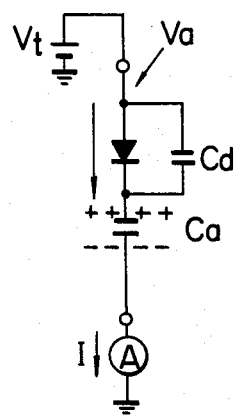
FIGS. 6e and 6f are equivalent circuit diagrams to illustrate operations of a picture element taking place when a charge signal is read out.
Figure 6F:
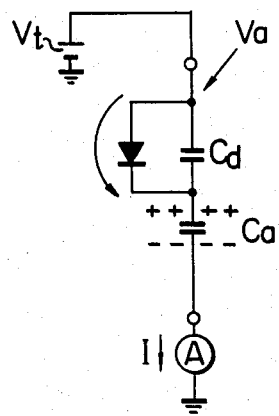

FIGS. 6a and 6b show equivalent circuit diagrams of unit picture elements, FIGS. 6c and 6d are to illustrate in equivalent circuit diagrams operations of the picture elements in which a signal is stored, and FIGS. 6e and 6f are equivalent circuit diagrams to illustrate operations of the picture elements taking place in the reading-out of the signal charge. In this conjunction, it is to be noted that FIGS. 6a, 6c and 6e are views for the unit picture element constituted by a serial connection of a diode and a photoconductor thin film, while FIGS. 6b, 6d and 6f concern the unit picture element which is constituted by an anti-serial connection of a diode and a photodiode. In these figures, portions designated by reference letters a represents the diode, while portions designated by letters b correspond to the photodiodes or photoconductors (photoconductor films).

When the signal charge is stored, both ends of the unit picture elements are connected to the ground (refer to FIGS. 6c and 6d). Since positive charge has been injected in the node A at the time of resetting (i.e. at the time of the preceding read-out), all the diodes are biased in the backward direction and lie in the current cut-off state, when both ends of the picture element are connected to the ground. In this state, the node A is electrically completely isolated from the ambience or other circuit elements except for dark currents and capacitive leakage current of the diode and the photoconductive film (or photodiode). The charge stored at the node A can be drawn only through the photoelectrically generated current or photo-current ($I_{ph}$), whereby information of the light intensity is stored at the node A in the form of the quantity of charge.

When the initial charge value at the node A is represented by $V_O$, potential $V_a$ prevailing at the node A after lapse of the storage time t is expressed as follows:

$$V_a = V_0 - \frac{I_{ph} \cdot t}{C_a + C_d}$$

where $C_a$ represents capacitance of the photoconductor film or the photodiode and $C_d$ represents capacitance of the diode.

The initial charge value or potential $V_O$ is determined by the value of the potential $V_a$ at the time of resetting. That is, $$V_a = V_T - V_d$$

where $V_T$ represents a voltage applied to the top end of the picture element at the time of resetting, and $V_d$ represents a forward voltage drop produced across the diode.

When the top end of the picture element is then grounded, the diode is turned off with the charge being distributed between the capacitances $C_a$ and $C_d$. The initial value $V_O$ can thus be determined in accordance with the following expression:

$$V_0 = \frac{C_a}{C_a + C_d} V_t - V_d$$

For the signal read-out operation, the voltage $V_T$ is applied to the top end of the picture element to turn on the diode, causing thereby the node A to be charged again. An integrated value $Q_s$ of a current (I) flowing during this process contains the optical signal charge $I_{ph} \cdot T_s$, as can be seen from the following expression:

$$Q_s = \int I_{dt} = \frac{C_a}{C_a + C_d} (C_d V_t + I_{ph} \cdot T_s)$$

where $T_s$ represents storage duration.

In the following, description will be made of a method of reading out the optically charged signals one-by-one from the picture elements arranged in the matrix array.

Figure 7A:
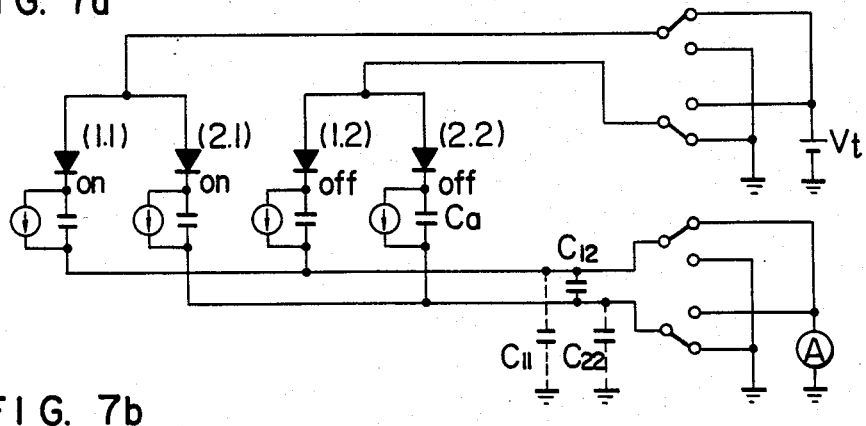
FIGS. 7a and 7b are circuit diagrams to illustrate connections of picture elements in matrix configurations.
Figure 7B:
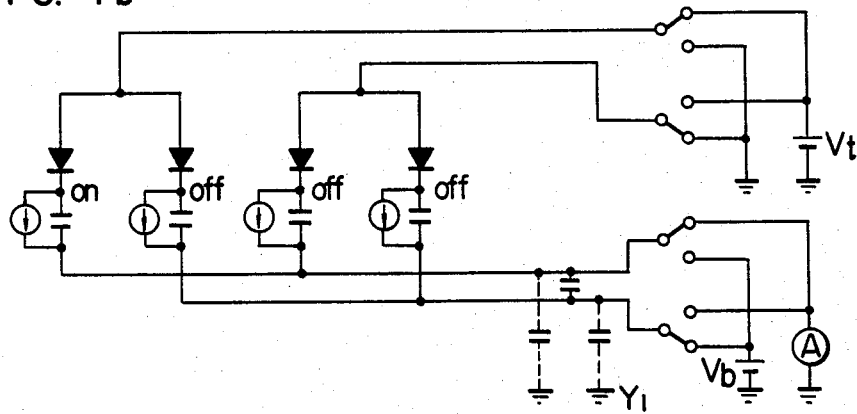

In FIG. 7a, there is illustrated the state in which the picture element located at (x, y=1, 1) is selected in the circuit where the picture elements described above are wired in the matrix driven array. In this figure, symbols $C_{12}$, $C_{11}$ and $C_{22}$ represent parasitic capacitances of the row wiring conductors. In this state, not only the picture element located at (1, 1) but also the one located at (2, 1) will be simultaneously selected. With a view to excluding such a situation, the row wiring conductor which does not take part in the read-out operation to be effected is connected to the backward bias voltage source $V_b$, as is shown in FIG. 7b. In this manner, the diode of the picture element located at (2, 1) can be turned off. In this connection, it should be mentioned that similar problem will not arise in the case of the other picture elements located at (1, 2) and (2, 2) because the associated diodes are deeply biased in the backward direction.

Now, FIGS. 7a and 7b show a matrix of two rows and two columns as an example of the matrix configuration to simplify the explanation of the operation thereof. In this case, a group of the picture elements (1, 1), (2, 1) and the other group of the picture elements (1, 2), (2, 2) respectively associated with the diode rows 26-1 and 26-2 in FIG. 4a.

Figure 8:
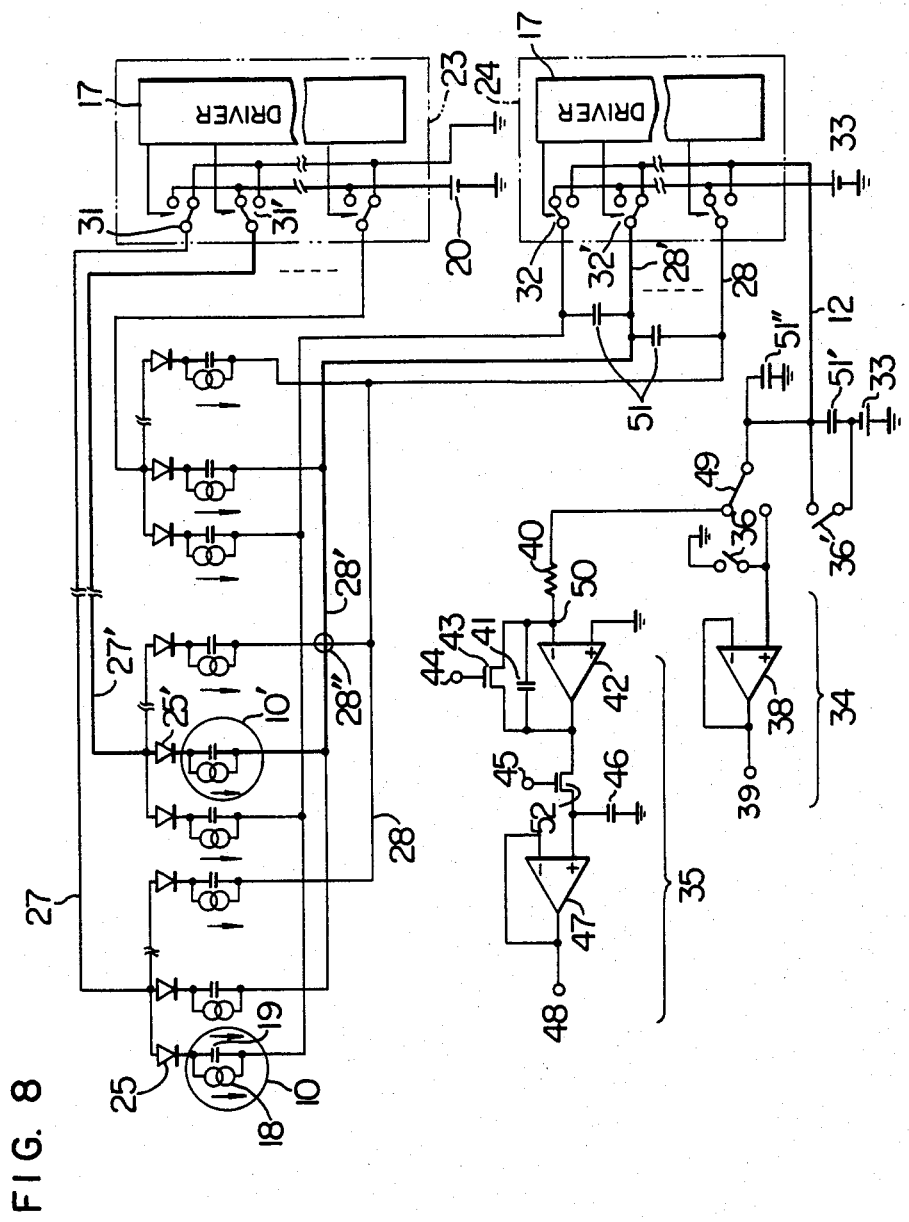
FIG. 8 is a circuit diagram of a scanner circuit of the photosensor according to an exemplary embodiment of the invention.

FIG. 8 shows by way of example, a whole circuit arrangement of the contact type linear sensor device shown in FIGS. 4a and 5a. A numeral 10 denotes the photodiode in an equivalent circuit in which a numeral 18 denotes a photo-current source and 19 denotes an equivalent capacitor. A numeral 23 denotes a scanner IC and 31 denotes a two-terminal switch constituted by two MOS transistors. For selecting the picture element, the blocking diode 25 is biased in the forward direction so that the photodiode 10 is connected to the bias voltage source 20, while the photodiode 10 is connected to the ground when the associated picture element is not selected. In FIG. 8, there is illustrated the state in which the column 27' is selected by the two-terminal switch 31'. A reference numeral 17 denotes a driver for selecting one-by-one these switches. To this end, a 2-phase dynamic shift register may be employed, by way of example. A numeral 24 denotes the row scanner IC, and 32 denotes a two-terminal switch which is constituted by a pair of MOS transistors and serves to connect the associated row wiring conductor 28 to the output line 12 in the select mode and to the blocking diode back-biasing voltage source 33 in the non-select mode. In FIG. 8, there is shown the state in which the row wiring conductor 28' is selected. The signal of the picture element 10' can be read out to the output line 12 by way of a route indicated by a thick solid line. The row wiring conductor 28 is constituted by two layer metalizations. At locations where the wiring conductors intersect each other as indicated at 28'', capacitances are formed between the intersecting conductors. These capacitances are represented generally by a parasitic capacitor 51 in FIG. 8. As will be described in detail hereinafter, the parasitic capacitance gives rise to the appearance of a DC output voltage higher than the signal output voltage on the output line 12, which makes succeeding signal processings such as integration, amplification and the like quite difficult. With a view to cancelling the disturbing DC output voltage, a capacitor 51' of a capacitance equal to that of the parasitic capacitor 51, a voltage source 33' for supplying a voltage of the same absolute magnitude as that of the bias voltage 33 but having the reversed polarity, a switch 36' for connecting the voltage source 33' to the output line immediately before the signal read-out, and capacitors 51'' of the capacitance equal to the parasitic capacitances of other picture elements are connected in the manner as illustrated in FIG. 8. The output circuit may be implemented in the form of either a voltage read-out circuit as generally designated by 34 or a current read-out circuit generally designated by 35. The voltage read-out circuit 34 is so arranged that the voltage on the output line 12 which is increased in dependence on the signal charge stored in the capacitor 19 of the photodiode is delivered to the output terminal 39 through a high input impedance amplifier. After the read-out cycle, the scanner switch remains as it is, while the picture element 10' is reset by the switch 36. In other words, the picture element is applied with the bias voltage 20 to be thereby restored to the initial state. In the case of the sensor used for reading a document of A4 size (width of 21 cm) and having a resolution of 8 lines/mm, the signal charge stored in the picture element 10' will not amount to more than about 1.7 PC even at saturation. On the other hand, capacitances of the capacitors 51, 51' and 51'' constituting the loads are as large as about 100 pF. As the consequence, the voltage making appearance on the output line 12 is 17 mV on the assumption that the preceding signal charge has been transferred to these capacitors 51, 51' and 51''.

The current read-out circuit 35 is composed of a current integrator 42, an integration capacitor 41, a capacitance resetting switch 43, a sampling switch 52, a signal hold capacitor 46 and a high input impedance amplifier 47. All the charge $Q_S$ stored in the picture element 10' is fed to the current read-out circuit 35 in the form of a current and stored in the integration capacitor 41 (capacitance: $C_F$). There makes appearance at the output of the integrator 42 a voltage $-Q_S/Q_F$ in dependence on the signal charge $Q_S$ stored in the capacitance 41. For example, assuming that the capacitance $C_F$ is 1 pF, the signal voltage is about 1.7 volts at saturation as in the case of the voltage read-out circuit described above. The succeeding sample and hold circuit functions to sample the voltage of $-Q_S/C_F$ upon completion of the integration and hold the sampled voltage until the next sampling time point.

Figure 9A:
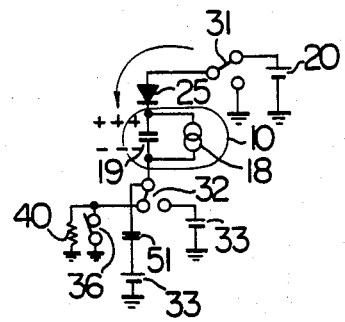
FIGS. 9a, 9b, 9c, 9d and 9e show equivalent circuits to illustrate the principle of operation of a linear sensor according to the invention.
Figure 9B:
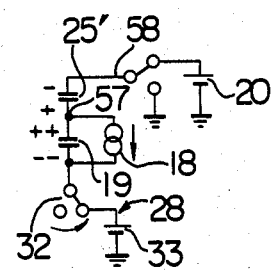
Figure 9C:
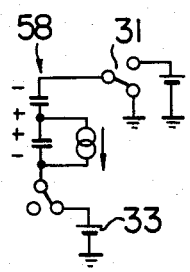
Figure 9D:
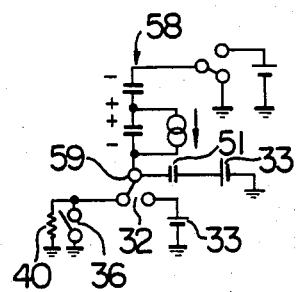
Figure 9E:
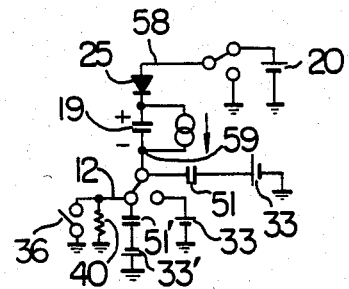

Next, operation mechanism of the matrix-driven read-out system will be described more concretely by referring to the equivalent circuits shown in FIGS. 9a to 9e and the timing chart shown in FIG. 10. At first, referring to FIG. 9a one end of the diode 25 is connected to the bias voltage source 20, while the end of the capacitance 19 opposite to the diode 25 is connected to the ground through the switch 36 or the resistor 40. As the result, the diode 25 is biased in the forward direction to be turned on, whereby the video bias voltage 20 is charged in the capacitance 19 of the photodiode 10. Subsequently, the switch 32 is changed over to thereby make connection to a power source 33 (FIG. 9b). Then, the diode 25 is biased backward to block the current flow. The diode can then be equivalently utilized as capacitance, as indicated by 25'. In this state, the node 57 located between the capacitances 25' and 19 is completely isolated from the other circuit components except for the photo-current source 18. Accordingly, since the charge of the node 57 is discharged through the photo-current source 18 in dependence on impinging light signal, a corresponding photoelectrically generated charge is stored at the node 57. When the photoelectrically generated charge is held in the stored state for reading out other picture elements, the switch 31 is changed over to connect the circuit point 58 to the ground shown in FIG. 9c, or the switch 32 is additionally changed over to thereby connect the circuit point 59 to the load capacitor 51 or to the load resistor 40 with the circuit point 58 being grounded, as shown in FIG. 9d. In any case, it is necessary to cut off the diode 25 for the period during which the stored signal charge is held at the node 57, to thereby prevent occurrence of the cross-talk with other picture elements. Meanwhile, the diode 25 is most likely to be turned on immediately before the read-out operation takes place. This state is illustrated in FIG. 9e. At that time, although the row wiring conductor 28 is connected to the voltage source for backward biasing the diode 25, the column wiring conductor 58 is connected to the voltage source 20 for biasing forward the diode 25, while the capacitance 19 is substantially completely discharged for storing the signal charge, producing substantially no voltage drop. In this state, the diode 25 is likely to be turned on under the forward bias. Under the circumstance, it is necessary to prevent the diode 25 from being turned on by increasing adequately the voltage $V_B$ of the power source 33. When the stored signal charge is represented by $Q_S$ (coulomb), the value of capacitor 19 is represented by $C_a$, the capacitance value of the diode 25 by $C_d$, and the voltage drop produced when the diode 25 is forward biased is represented by $V_d$, the forward voltage V applied across the diode is given by the following expression:

$$V = \frac{Q_S - C_a(V_B - V_d)}{C_a + C_d} \quad (1)$$

For the voltage V not to be positive, the following condition has to be satisfied. That is, $$V_S > Q_S/C_a + V_d \quad (2)$$

In the case of the sensor of which photoconductor thin film is formed of amorphous silicon (Si) and which has a sensing width of 220 mm and a resolution of 8 lines/mm, the maximum value of $Q_S$ is about 1.7 pC and the value of $C_a$ is about 0.17 pF. Thus, when the diode 25 is constituted by a silicon (Si) diode, the source voltage $V_B$ has to be higher than 10.5 volts, because $V_d = 0.5$ volts. The read-out of the signal is effected by connecting the circuit point 58 to the bias voltage source 20 while connecting the circuit point 59 to the output line 12. At that time, since the voltage source 33 is coupled to the output line 12 through the parasitic capacitance 51, the voltage on the output line is caused to increase.

Thus, the voltage power source 33 is connected to the diode 25 through the switch 32 in one case and connected to the output line through the parasitic capacitance 51 in another case. In order to show these two case clearly, each of FIGS. 9d and 9e shows two power sources 33 separately. The increment in the output voltage is of a significantly great magnitude as compared with the intrinsic signal component, thus involving difficulty in the succeeding signal processing, as described hereinbefore. To obviate the difficulty, this increment in the output voltage is cancelled by means of the capacitance 51' and the voltage source 33', as described hereinbefore in conjunction with FIG. 8.

Figure 10:
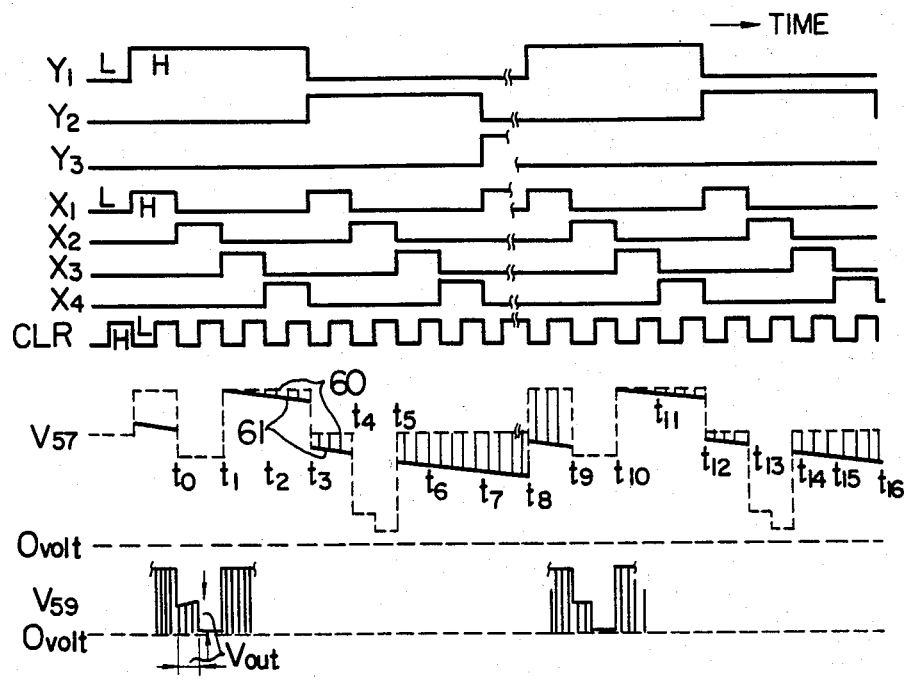
FIG. 10 shows a timing chart to illustrate scanning operation of a linear photosensor according to the invention.

FIG. 10 shows a timing chart for illustrating the driving operation of the circuit shown in FIG. 8 on the assumption that the matrix is composed of three columns and four rows for simplification of description. Referring to FIG. 10, $Y_1$, $Y_2$ and $Y_3$ represent pulse voltages applied to the column wiring conductors 27, wherein L indicates the ground potential level with H indicating the level of bias voltage 20 applied to the photodiode or the photoconductor thin film. The bias voltage 20 is sequentially applied to the groups of the photodiode or the photoconductor thin films connected to the respective column wiring conductors, as can be seen from the waveforms $Y_1$, $Y_2$ and $Y_3$. On the other hand, pulse voltages $X_1$, $X_2$, $X_3$ and $X_4$ illustrated in FIG. 10 are applied to the row wiring conductors 28, respectively, whereby all the rows $X_1, \ldots, X_4$ are scanned during the period in which any one of the column wiring conductors $Y_i$ is at H-level. It is to be noted that the switch 32 is changed over to the power source 33 in response to the L-level, while the switch 32 is changed over to the output line 12 in response to the H-level. Immediately after the read-out operation, the clear switch 36 is closed to reset the associated photodiode at the timing represented by CLR in FIG. 10. Changes in potential $V_{57}$ occurring at the circuit point 57 of the photodiode located at the intersection between the first column and the second row are also illustrated in FIG. 10. It will be seen that during a period of $t_0$ to $t_1$, the photodiode is read out and reset, while the signal charge is stored in the photodiode during a period of $t_1$ to $t_9$, which is followed by a period of $t_9$ to $t_{10}$ during which the signal charge is again read out and the photodiode is reset. A broken line curve 60 represents the state where no optical input is present. On the other hand, a solid line curve 61 corresponds to the case where the optical input is present and the voltage $V_{57}$ is progressively lowered due to storage of the signal charge. Further, because the connection state of the photosensor varies as time elapses as described hereinbefore by referring to FIGS. 9a to 9e, the voltage $V_{57}$ illustrated in FIG. 10 undergoes corresponding variations. However, it should be noted that the charge stored at the node 57 undergoes the only variations that are brought about by the photo current, so long as the condition for the source voltage $V_B$ defined by the expression (2) is fulfilled. Referring to FIG. 10, a waveform $V_{59}$ represents the voltage at the circuit point 59 on the assumption that the voltage read-out method mentioned hereinbefore is adopted without using the resistor 40. The output voltage as obtained is indicated by $V_{out}$.

Figure 11:
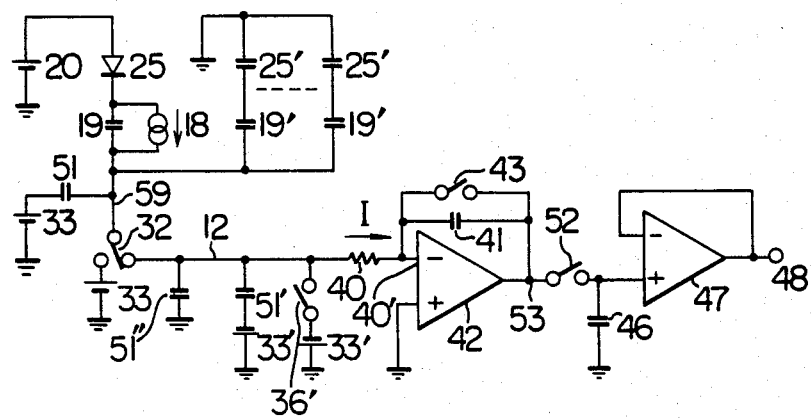
FIG. 11 is a circuit diagram of a current read-out circuit.
Figure 12:
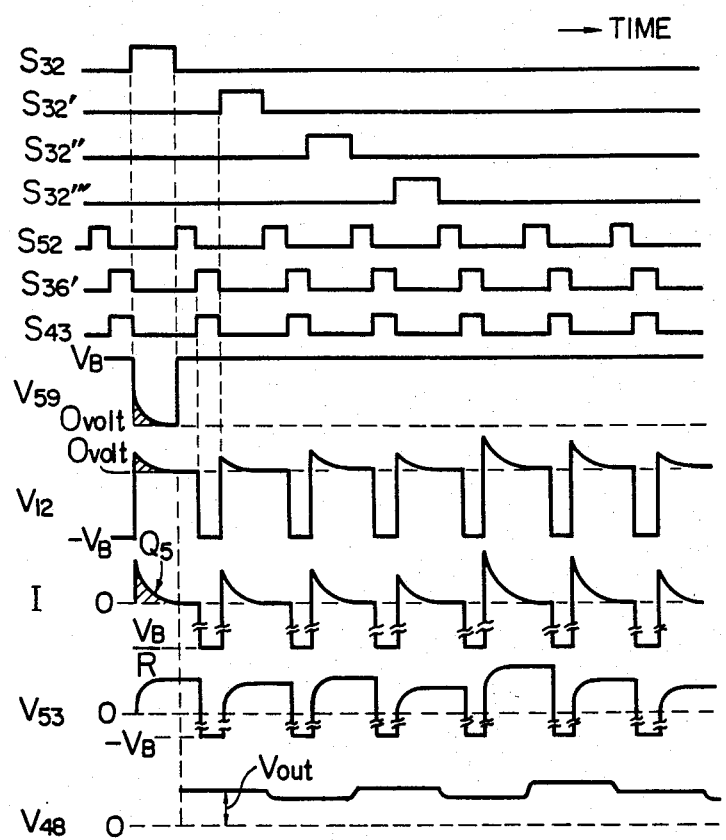
FIG. 12 shows a signal waveform diagram to illustrate operation of the circuit shown in FIG. 11.

Next, referring to FIGS. 11 and 12, description will be made of the current read-out circuit which allows a higher output voltage to be derived as compared with the voltage read-out circuit. Referring to the timing chart illustrated in FIG. 12, when pulse signals $S_{32}$, $S_{32}'$, $S_{32}''$, $S_{32}'''$, $S_{52}$, $S_{36}'$ and $S_{43}$ are at H-level, the switches 32, 32', 32'', 32''', 52', 36' and 43 are turned on, respectively, in the manner mentioned below. At first, the switch 32 is changed over to the output line and at the same time the switch 36' is turned off, whereby the voltage signal component of the charge stored in the diode capacitance 19 as indicated by the hatched area of $V_{12}$ is outputted onto the output line 12. In this case, provided that the parasitic capacitance 15'' ascribable to the dual or two-layer wiring is equal to the dummy capacitance 51'', a sum of the capacitances 25' and 29' of other picture elements connected to the circuit point 59 is equal to the dummy capacitance 51'' and that absolute magnitudes of the source voltages 33 and 33' are equal to each other, only the signal component makes appearance at the terminal 12 and is discharged through a load resistor R denoted by a reference numeral 40 in FIG. 11, to be finally zero volts. Meanwhile, the reset-switch 43 of the integrator 42 is opened, whereby the capacitor 41 is charged with the current flowing through the load resistor R(42). Since the integration amplifier 42 is provided with negative feedback through the capacitor 41, the minus (−) input terminal 40' of the amplifier 42 is caused to be at the same potential as the plus (+) input terminal (i.e. the ground potential) thereof in appearance. Thus, the current I seems in appearance to be drawn to the ground through the resistor R. However, because of very high impedance of the input terminal 40', all the current flows in reality into the capacitor 41 to charge the latter. This current is illustrated at I in FIG. 12. Since all the signal charge $Q_S$ discharged from the photodiode capacitance 19 passes through the load resistor R(42), the integrated value of the current I (indicated by the hatched area) represents the signal charge $Q_S$. When the value of the integration capacitor 41 is represented by $C_F$, the voltage appearing at an output terminal 53 takes a value given by $Q_S/C_F$. At the time point when this output voltage is stabilized, the voltage is transferred to a hold capacitor 46 under the timing of the sampling pulse $S_{52}$. The voltage appearing at the hold capacitor 46 is received by the high input impedance amplifier 47, resulting in that a signal $V_{48}$ as held (refer to FIG. 12) makes appearance at the output terminal of the amplifier 47.

Figure 13:
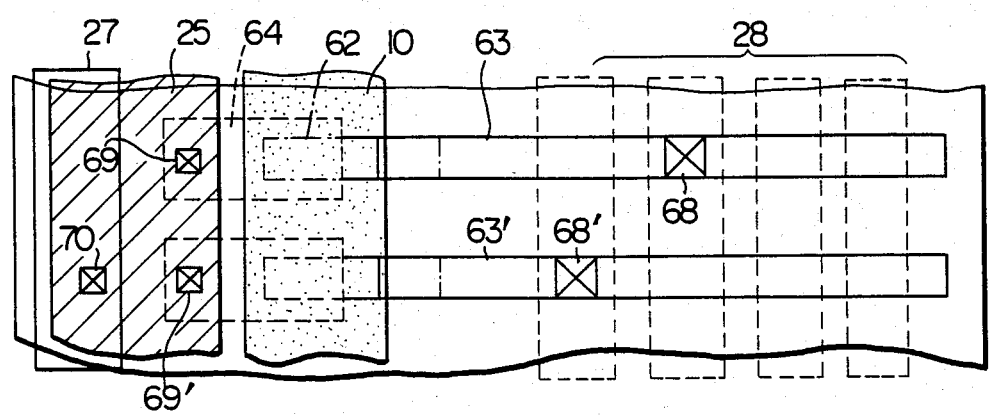
FIG. 13 shows in a fragmental plan view a structure of the photosensor according to an exemplary embodiment of the invention in which a diode array chip is employed.
Figure 14:
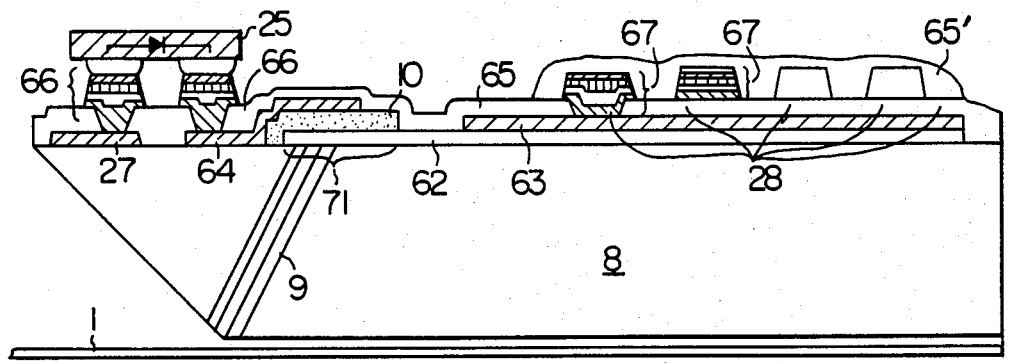
FIG. 14 is a sectional view of the same.

FIGS. 13 and 14 show, respectively, in a fragmental top plan view and a sectional view an exemplary structure of a sensor implemented according to the invention. In the figures, a reference numeral 1 denotes a document to be read by the sensor, 8 denotes a glass substrate, 9 denotes optical fibers, 10 denotes photoconductor films capable of exhibiting the function of photodiodes, 25 denotes the diode array, 62 denotes transparent nesa electrodes deposited on the illuminated side of the photodiodes, 63 denotes Al-wiring for the row scanning, 64 denotes Al-wiring for the column scanning, 65 denotes an isolation thin film for the multi-layer wiring, 66 denotes pedestals for bonding and electrically connecting the diode array 25, 68 and 68' denote through-holes formed in the isolation film 65 for connecting wires or conductors 28 to the row scanning Al-wiring 63, and 70 denotes throughholes for connecting the diode array 25 to conductors 27. In the first place, a process of manufacturing the sensor of the structure mentioned above will be described in brief. At a first step, the transparent electrode 62 is formed all over a whole surface of the glass substrate. The transparent electrode can be formed by depositing ITO (tin oxide containing indium) or $SuO_2$ in thickness of about 1000 Å or semi-transparent Ta by RF sputtering. Subsequently, a Ni-Cr layer of 450 Å thick and Al layer of 0.8 μm thick are deposited by vacuum-evaporation. Thereafter, the layers of ITO and Al are removed by etching so that patterns of the transparent nesa electrodes 62 and the row scanning Al-wiring 63 are formed. Then, the Al layer is removed only at regions indicated at 72. Next, amorphous silicon is deposited in thickness of about 2 μm by RF sputtering to thereby form the photoconductor films 10 only at the regions indicated by the numeral 10 by using a corresponding mask. Then, Al is deposited in thickness of about 0.8 μm over the film 10 except for regions located on the right side of the photodiodes. Thereafter, the regions located on the right side of the photodiodes are covered with photoresist and then the Al-pattern located over and at the left side of the photodiodes is removed by photolithography so that the patterns 27 and 26 are formed. A polyimide isolation film (e.g. poly-imide-iso-indro-kinasolinedion) of about 4 μm thick is coated over the whole surface of the sensor. Next, the through-holes 70, 69 and 68 are formed in the poly-imide resin film by photolithography at locations where connections are to be made to the diode 25 and to the second-layer wiring 28. Finally, Cr and Cu are deposited in thicknesses of 0.07 μm and 0.05 μm, respectively, through vacuum evaporation, to thereby form the exposed pedestals 66 for connection to the diode chip 25 and the exposed dual-layer wiring 67 through an exposure-development process by using corresponding photoresist masks. In this state, Cu is deposited in thickness of 5 μm, which is followed by deposition of Pb in thickness of 3 μm and then deposition of Su in thickness of 5 μm all by plating. Subsequently, after photoresist has been removed, the depositions of Cu in thickness of 0.5 μm and Cr in thickness of 0.07 μm are etched by using the pattern mentioned above as a mask. Thus, the completed pattern is obtained. Finally, the diode array 25 is bonded to the completed sensor assembly in the manner illustrated in FIGS. 13 and 14.

Although not illustrated in the figures for the clarification of illustration, it is to be noted that a two-layer wiring is formed on the right side of the photodiodes 10 for applying the diode isolating voltage.

Figure 15:
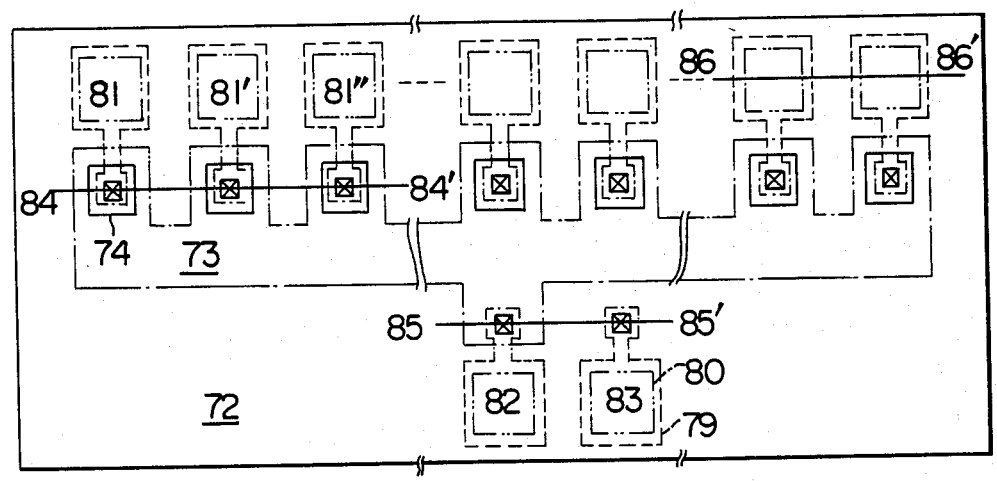
FIG. 15 is a plan view to show a structure of a diode array employed in the photosensor.
Figure 16:
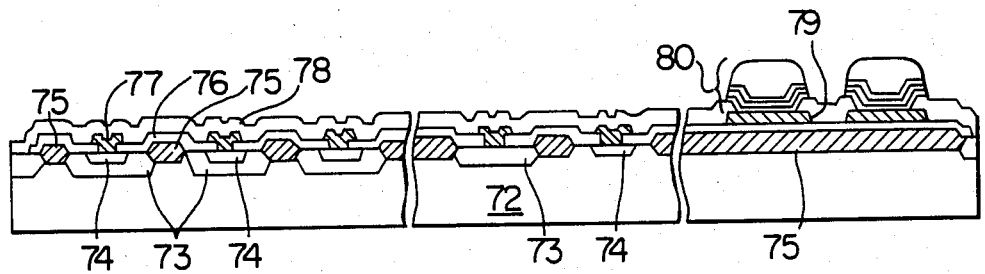
FIG. 16 is a sectional view of the diode array.

Referring to FIGS. 15 and 16 which show, respectively, in a plan view and a sectional view a structure of the diode array used in the sensor according to the invention, a reference numeral 72 designates a n-type semiconductor substrate, 73 denotes a p-type diffusion layer, and a numeral 74 designates a n-type diffusion layer, wherein a junction between the layers 73 and 74 constitutes one of the diodes. By applying the backward bias between the substrate 72 and the p-type diffusion layer 73, cross-talk which may otherwise occur due to diffusion of carriers to and from the diodes can be suppressed. A reference numeral 75 denotes a thermally oxidized film for isolation of 1 μm in thickness, 76 denotes an isolation or insulation film of PSG (phosphorated glass) of 0.8 μm in thickness, 77 denotes electrodes of the Al-wiring, 78 denotes a $SiO_2$-isolation film deposited through CVD process, 79 denotes Al-electrodes for bonding terminals, and 80 denotes solder bumps for connection to the substrate each of which is constituted by a stack of Cr, Cr-Cu, Cu-Su and Pb-Su laminated in this order as viewed from the bottom, being formed through evaporation and plating. In FIG. 15, numerals 81, 81', 81" and so forth denote terminals connected to the photodiodes, 82 designates terminals connected to the column scanning conductors, and 83 denotes a terminal for applying voltage to the substrate 72. It should be recalled that the backward bias is applied between the terminals 83 and 82 for attaining satisfactory isolation of the diode.

Figure 17:
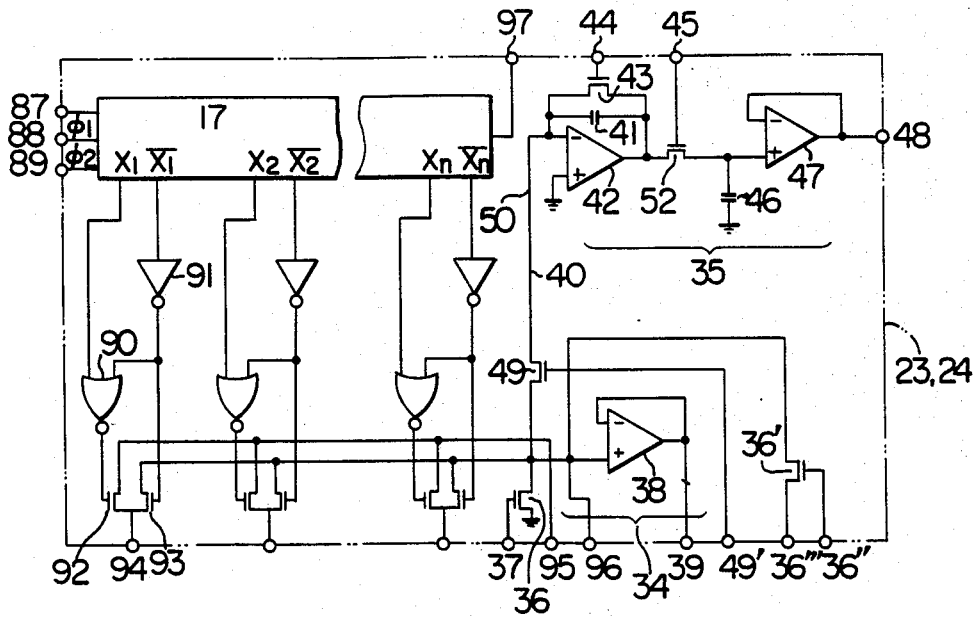
FIG. 17 is a block diagram to show a circuit arrangement of a scanner IC.

FIG. 17 shows a circuit diagram of the scanner IC employed in the sensor according to the invention. It is to be noted that the same IC is used for both the column scanning and the row scanning. A reference numeral 17 denotes a two-phase dynamic shift register having output terminals $X_1, \ldots, X_n$ and adapted to produce output pulses at the terminals $X_1, \ldots, X_n$ in synchronism with two-phase clock pulse signals $\phi_1$ and $\phi_2$ in response to a start signal applied to a terminal 87. Symbols e,ovs/$\overline{X}$/$\overline{1}, \ldots, \overline{X}_n$ designate output terminals at which signals complementary to those appearing at the terminal $X_1, \ldots, X_n$ make appearance. The output signals derived from the output terminals $X_1$ and $\overline{X}_1$ are applied through a NOR circuit 90 and an inverter 91 to the gate electrodes of MOS transistor switches 92 and 93 with polarities opposite to each other and without being overlapped, whereby signal inputted to an input terminal 94 is transmitted to a terminal 95 or 96. The terminal 96 is connected to a resistive load circuit 35 or a capacitive load circuit 34 internally of the IC. These load circuits 34 and 35 have output terminals 48 and 39, respectively. Operation of the IC circuit has been described hereinbefore.

Figure 18:
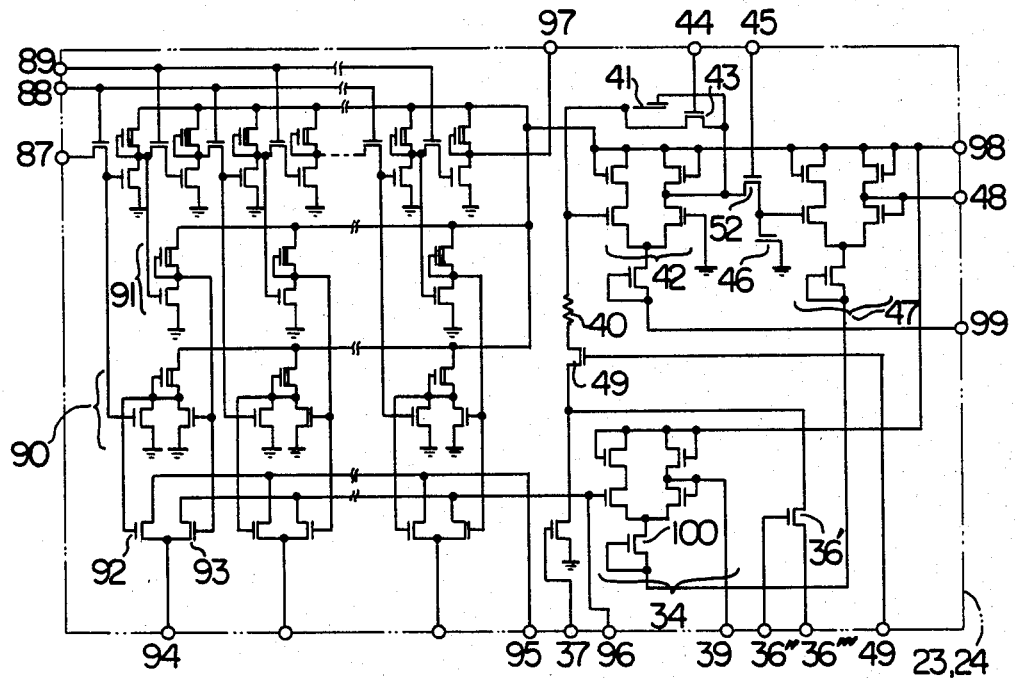
FIG. 18 is a circuit diagram to show an exemplary concrete arrangement of the IC.

FIG. 18 shows a concrete circuit configuration of the circuit shown in FIG. 17 implemented through n-channel process. For attaining a low power consumption and a high speed operation, MOS transistors of depletion type and enhancement type are mixedly employed. The depletion type MOS transistors are identified by lines inserted in respective channel regions. The capacitors 41 and 46 are also implemented in the form of MOS capacitor. A MOS transistor 100 serving as a current source for the MOS-type amplifiers 42, 47 and 43 is formed in a P-well to thereby allow a negative voltage to be applied to a terminal 9, which in turn means that the dynamic ranges of these amplifiers are enlarged. A terminal 98 is connected to a power supply source for the amplifiers and the shift register described above.

As will be appreciated from the foregoing description, the photosensor which embodies the driving scheme according to the invention is capable of performing the scanning operation with a significantly reduced number of constituent elements as compared with the hitherto known sequential driving type sensor and can enjoy excellent manufacturing efficiency and inexpensiveness.

It should here be mentioned that the invention is never restricted to the illustrated structures of the photosensor. It goes without saying that many modifications and variations which conform to the illustrated equivalent circuits may readily occur to those skilled in the art.

We claim:

1. A photosensor comprising an array of a plurality of unit picture elements each of which is constituted by a serial connection of a photoconductor film and a diode, wherein said plurality of unit picture elements are grouped into at least two groups, the unit picture elements belonging to the respective groups being connected to a corresponding first group of wiring conductors provided in association with said groups, respectively, while the unit picture elements belonging to the different groups and located at the same positions in the different groups relative to one another are connected together to a respective second group of wiring conductors, including first means for applying a voltage to a selected wiring conductor of the first group of wiring conductors which selected wiring conductor is connected to a selected one of said at least two groups of picture elements which includes picture elements from which a signal is to be read out, said voltage serving for biasing forward the diodes of said picture elements to be read out, while no forward bias voltage is applied to other wiring conductors of the first group of wiring conductors connected to other groups of the unit picture elements which do not include the picture elements from which signals are to be read out; and second means provided for wiring conductors of the second group of wiring conductors connected to the unit picture elements to be read out for sequentially biasing forward the diodes of said picture elements to be read out, so that electric charges stored at nodes located between said photoconductor films and said diodes, respectively, are sequentially read out as signals by the operation of said first and second means.

2. A photosensor according to claim 1, wherein said unit picture elements are arranged in a one dimensional array, and wherein each of said groups is formed by unit picture elements which are disposed adjacent to one another.

3. A photosensor according to claim 1 or 2, further comprising means for making parasitic capacitance present in one of said second group of wiring conductors equal to capacitance coupled to one of the second group of wiring conductors through which the read-out is to be effected, and means for making a voltage applied to one of the second wiring conductors through which no read-out is effected equal to the absolute magnitude of the voltage applied to one of the second group of wiring conductors through the capacitor for read-out operation but with a polarity opposite to that of the last mentioned voltage.

4. A photosensor according to claim 1, wherein, when said first means is applying the voltage to a selected one of said at least two groups of picture elements, said second means includes means for sequentially forward biasing diodes of individual picture elements of said selected group and means for back-biasing diodes of other picture elements of said selected group at times when the diodes of said other picture elements are not being forward biased.

5. A photosensor comprising an array of a plurality of unit picture elements each of which is constituted by a combination of a photodiode and a diode connected in series to said photodiode in the opposite rectifying direction, wherein said plurality of unit picture elements are grouped into at least two groups, the unit picture elements belonging to the respective groups being connected to a corresponding first group of wiring conductors provided in association with said groups, respectively, while the unit picture elements belonging to the different groups and located at the same positions in the different groups relative to one another are connected together to respective second group of wiring conductors, including first means for applying a voltage to a selected wiring conductor of the first group of wiring conductors which selected wiring conductor is connected to a selected one of said at least two groups of picture elements which includes picture elements from which a signal is to be read out, said voltage serving for biasing forward the diodes of said picture elements to be read out, while no forward bias voltage is applied to other wiring conductors of the first group of wiring conductors connected to other groups of the unit picture elements which do not include picture elements from which signals are to be read out; and second means provided for wiring conductors of the second group of wiring conductors connected to the unit picture element to be read out for sequentially biasing forward the diodes of said picture elements to be read out, so that electric charges stored at nodes located between said photodiodes, respectively, are sequentially read out as signals by the operation of the first and second means.

6. A photosensor according to claim 5, wherein said unit picture elements are arranged in a one dimensional array, and wherein each of said groups is formed by unit picture elements which are disposed adjacent to one another.

7. A photosensor according to claim 5 or 6, further comprising means for making parasitic capacitance present in one of said second group of wiring conductors equal to capacitance coupled to one of the second group of wiring conductors thorugh which the read-out is to be effected, and means for making a voltage applied to one of the second wiring conductors through which no read-out is effected equal to the absolute magnitude of the voltage applied to one of the second group of wiring conductors through the capacitor for read-out operation but with a polarity opposite to that of the last mentioned voltage.

8. A photosensor according to claim 5, wherein, when said first means is applying the voltage to a selected one of said at least two groups of picture elements, said second means includes means for sequentially forward biasing diodes of individual picture elemetns of said selected group and means for back-biasing diodes of other picture elements of said selected group at times when the diodes of said other picture elements are not being forward biased.

* * * * *